United States Patent [19]

Taranco et al.

[11] Patent Number: 4,576,837

[45] Date of Patent: Mar. 18, 1986

[54] METHOD OF TREATING SURFACES

[75] Inventors: Gregorio Tarancon, Woodbridge, N.J.; Efrain Acevedo, Yonkers, N.Y.; Abel Saud, Jersey City, N.J.

[73] Assignee: Tarancon Corporation, Edison, N.J.

[21] Appl. No.: 713,616

[22] Filed: Mar. 19, 1985

[51] Int. Cl.[4] .............................................. C23C 16/00

[52] U.S. Cl. .................................. 427/255.4; 427/400

[58] Field of Search .............................. 427/255.4, 400

[56] References Cited

U.S. PATENT DOCUMENTS

| | | | |
|---|---|---|---|
| 2,811,468 | 10/1957 | Joffre | 427/255.4 |
| 2,829,070 | 4/1958 | Osborn | 427/255.4 |
| 3,940,520 | 2/1976 | Dixon et al. | 427/400 |
| 3,988,491 | 10/1976 | Dixon et al. | 427/400 |
| 4,268,538 | 5/1981 | Toole et al. | 427/255.4 |
| 4,296,151 | 10/1981 | Boultinghouse | 427/255.4 |
| 4,474,828 | 10/1984 | Young et al. | 427/255.4 |

FOREIGN PATENT DOCUMENTS

| | | | |
|---|---|---|---|
| 788973 | 7/1968 | Canada | 427/400 |
| 710523 | 6/1954 | United Kingdom | 427/400 |

OTHER PUBLICATIONS

Lee et al, "$Eu_2O_3$ Passive Layer on RF Sputtered EuO Films", IBM Technical Disclosure Bulletin, vol. 13, No. 8, Jan. 1971.

*Primary Examiner*—S. L. Childs

*Attorney, Agent, or Firm*—Robert A. Green

[57] ABSTRACT

The method of treating a surface chemically by exposing the surface to a treating gas at high pressure for a time during which a surface reaction occurs, and then reducing the pressure of the gas for a time and removing reaction byproducts and then continuing the cycles of high pressure and low pressure until the surface reaction is completed.

3 Claims, 2 Drawing Figures

METHOD OF TREATING SURFACES

BACKGROUND OF THE INVENTION

There are many situations in industry where surfaces must be treated to achieve a desirable chemical condition. For example, polyethylene containers are treated to prevent the undesirable penetration of the walls of the containers by chemical substances. Various processes are known for treating surfaces to try to render them impervious to chemical penetration, however, none of these methods are entirely effective. The present invention provides an improved method for treating surfaces to achieve better surface condition than has been achieved heretofore in the prior art.

DESCRIPTION OF THE INVENTION

To discuss the invention in general terms, consider a conventional tubular reactor with a total volume R and provided with a solid partition which forms two identical compartments RA and RB. The volume of each compartment is R/b 2. External pipe interconnections provide communication between compartment RA and RB, and a bidirectional gas flow pump or blower system is included which can pump gas from one compartment to the other compartment. A gas reactant is introduced into both compartments at the same pressure, and the bidirectional pump compresses the gas in one compartment to promote the desired surface reaction, while simultaneously allowing the gas in the other compartment to expand to remove the byproducts of the reaction. By reversing the flow with the pump, each compartment is cycled from compression to expansion and vice versa, until the desired surface reaction is completed. The type of reaction between the gas reactant and the solid surface of the articles treated in the reactor, is: A+B=C+D where A represents the gas reactant, B represents the solid surface of the articles to be treated, C represents the solid surface of the articles treated and D represents the byproduct. As the reaction take place C and D stay together, but in order to complete the reaction, D must be removed from the surface of C.

When a compartment is in the compression mode, the concentration of the reacting gas increases, because the total number of molecules increases with the pressure increase. The number of collisions increases and the rate of reaction accelerates in proportion to an apparent increase in concentration. The accumulation of byproduct inhibits the reaction so that it is therefore necessary to remove the byproduct. When the cycle changes from compression to expansion, the compartment changes from a pushing effect to pulling effect. The pulling from the expansion, decreases the cohesive forces between the byproduct and the solid surface. This in effect, pulls the stagnant boundary layer of byproduct molecules from the solid surface. Now the clean solid surface is ready for the next compression cycle. This mode of compression/expansion is repeated until the reaction is completed on the solid surface.

Figure 1:
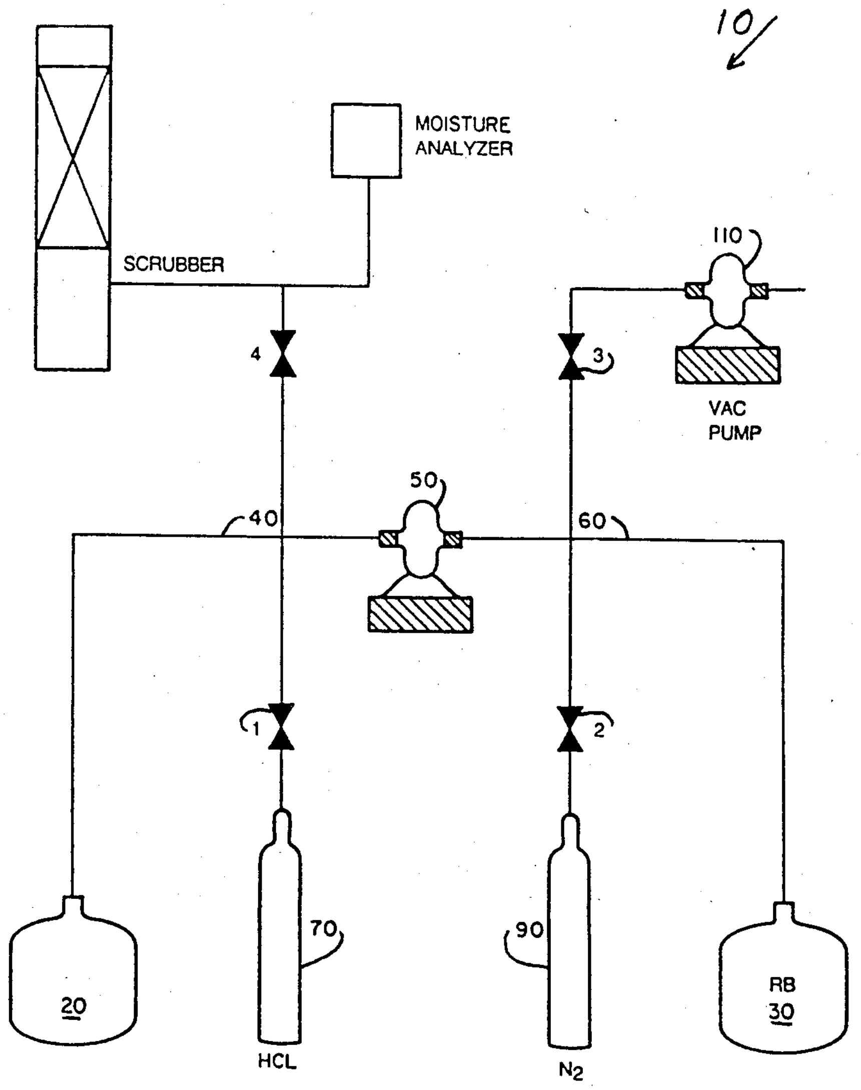
FIG. 1 is a schematic representation of an apparatus for performing the method of the invention.

One system 10 for practicing the method of the invention is shown in FIG. 1 and includes two steel cylinders 20 and 30 of equal volume. A pipe line 40 is connected from the steel cylinder 20 to one side of a bidirectional gas flow pump 50, and a similar pipe line 60 is connected from the steel cylinder 30 to the other side of the bidirectional pump 50. A source 70 of anhydrous hydrogen chloride is connected through a valve 1 to pipe 40, and a source 90 of nitrogen is connected through a valve 2 to the pipe 60. A vacuum pump 110 is connected through a valve 3 to the pipe line 60. Other apparatus may be included in system 10, if desired, as shown in part.

Cylinders for packing anhydrous hydrogen chloride, must be free of water and oxygen on the cylinders internal surface. Cylinders 20 and 30, are regular high pressure cylinders, about 2000 psi working pressure, with rusty internal surface (a layer of ferric oxide). In order to remove all the oxygen from the ferric oxide, a chemical reaction takes place between the solid ferric oxide in the internal surfaces of the cylinders 20 and 30, and gaseous anhydrous hydrogen chloride. The reaction product, is a layer of ferric chloride in the internal solid surface, where the oxygen was replaced by chlorine, and as a byproduct, water adheres to the solid surface. In operation of system 10, the vacuum pump 110 is operated to pull a vacuum in the two cylinders 20 and 30, and then valve 3 is closed. Next, hydrogen chloride is introduced into two cylinders 20 and 30 up to 15 psig, and this condition is maintained in the cylinders for a period of six hours. After this period of time, an analysis of water concentration proved that 50 ppm by volume was found in the gas phase. Under the same condition, a new set of cylinders 20 and 30 was connected to the manifold, but now a cyclic compression/expansion is performed every 5 minutes. the pressure is cycled in cylinder 20 and in cylinder 30 from 20 psia to 40 psia, respectively, and from 40 psia to 20 psia. The analysis after six hours showed the concentration in the gas phase was 230 ppm.

This method demonstrates, the treatment by compression/expansion, accelerates the rate of reaction. The water removed from the solid surface is 360% higher, using compression/expansion, than using a stationary gas mode. The typical reaction for this example is:

| A | | B | C | | D |
|---|---|---|---|---|---|
| $Fe_2O_3$ solid surface untreated | + | 6HCl gas reactant | $2FeCl_3$ solid surface passivated | + | $3H_2O$ water by product |

Figure 2:
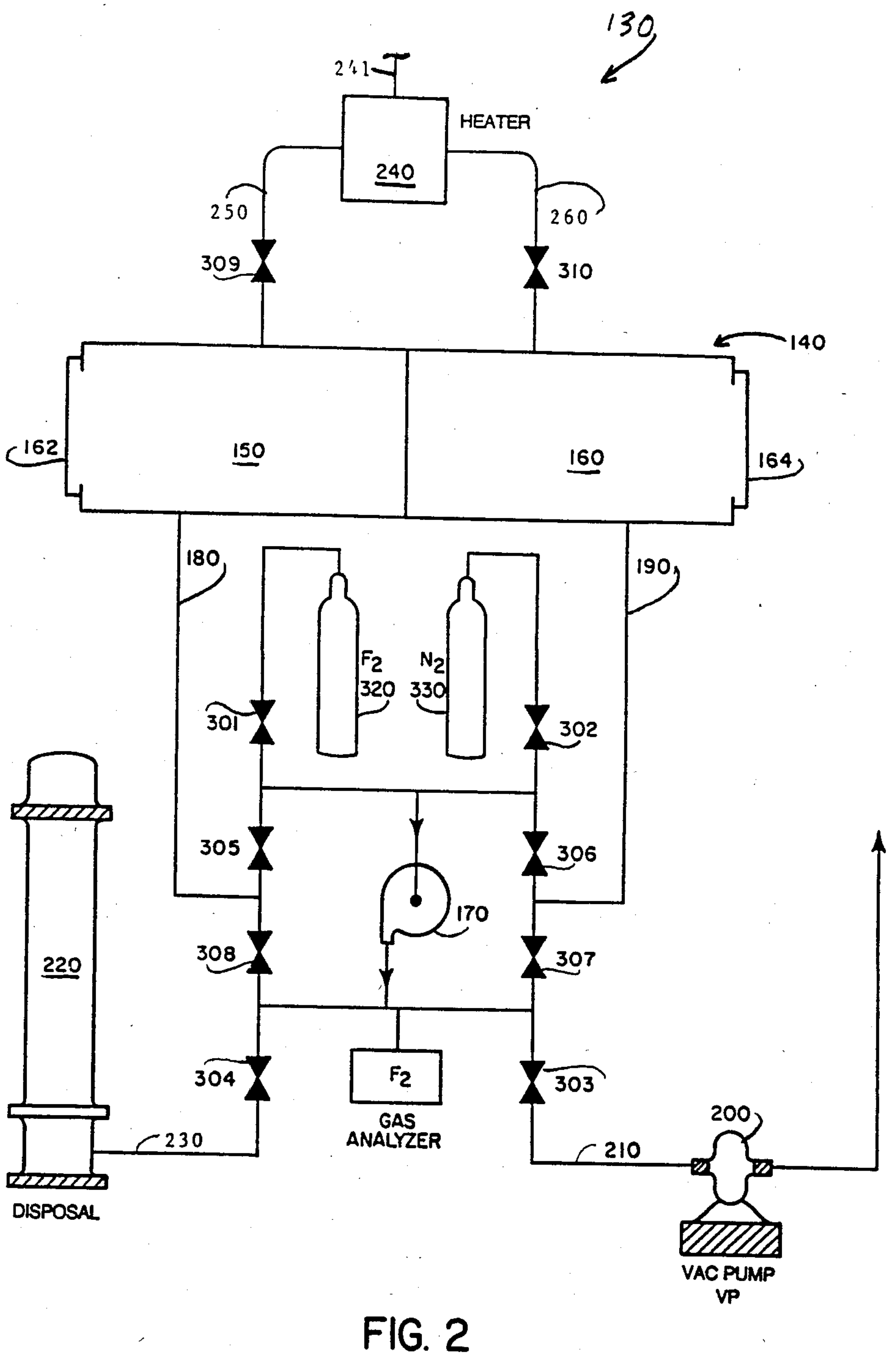
FIG. 2 is a schematic representation of other apparatus for performing the method of the invention.

Another example of the use of the principles of the invention is illustrated in a system 130, shown in FIG. 2, for treating polyethylene plastic containers. More specifically, system 130 is used to treat the surfaces of polyethylene plastic containers with gases that increase the barrier to the permeation of gases and liquids. The rectant gas in the embodiment of the invention is fluorine, but others such as bromine, sulphur, trioxide, bromotrifluoride or combination of the above may be used. Nitrogen is also used as a dilutant. Fluorinated polyethylene surfaces resist permeation by nonpolar organic chemicals.

This process utilizes one reactor vessel 140 with two compartments 150 and 160. The reactor can have any suitable shape, and each compartment is provided with an opening closed by a door 162 and 164, for introducing the solid articles of polymeric material to be treated. The reactor 140 may be of substantially any suitable volume, for example, about 25000 liters, and it may be of any suitable common material such as stainless steel, carbon steel, aluminum, monel, brass or the like. System 130 includes a bidirectional gas flow pump 170 having a plurality of valves to perform the operation described below. Compartment 150 is coupled by pipe line 180 to the pump 170, and compartment 160 is coupled by a pipe line 190 to the pump 170. A vacuum pump 200 is connected by a pipe line 210 to an array of valves. A disposal scrubber 220 is connected by a pipe line 230 to the pipes and valves. A heater 240 is coupled to each compartment, vessel or chamber 150 and 160 by the pipe lines 250 and 260 through valves 309 and 310. Valves 305, 306, 307 and 308 are gas direction flow valves. The heater 240 also has a damper 241 to air. Valves 309 and 310 are for the heater 240 and for air, valve 301 for the fluorine source 320, and valve 302 for nitrogen source 330. Valve 304 discharges to the scrubber 220, and valve 303 discharges to the atmosphere via the vacuum pump 200. In using the system 130, the compartments, vessels or chambers 150, 160 are filled with polyethylene plastic containers to be treated. The nominal volume of the containers should be at least 40% of the total volume of the vessels.

Next, the vessels are heated to operating temperature and this is done by pumping hot air from heater 240 and by properly opening and closing the valves, cycling the hot air back and forth between the two compartments. After a period of one to ten minutes, but preferably about 3 minutes, valves 305 and 307 are closed and valves 306 and 308 are opened and this causes the reverse in flow, which changes the direction of the gradient in temperature and by cycling 1 to 50 time with the valves combination, even temperature distribution is achieved. The range of temperature is from about 20 degrees centigrade to about 100 degrees centigrade, but preferable from 40 to 80 degrees centigrade. The cycling flow from one direction to the opposite direction produces the effect of even distribution of temperature over all the containers where the gradient approaches zero. The heating procedure is carried out at atmospheric pressure, when the desired temperature is reached, heater 240 is turned off, valves 309 and 310 are closed and 304,305 and 306 are opened and the blower 170 exhausts the air to the scrubber 220. When the pressure in compartments 150 and 160 reaches about 400 torr, valve 304 is closed, valve 303 is opened and pump 200 is operated. During this step, valves 305 and 306 are opened, valves 307 and 308 are closed. When the pressure in compartment 150 and in compartment 160 reaches 1 torr, valve 303 is closed and the vacuum pump is held on. Valve 307 and valve 308 are open and valve 301 is opened to let fluorine feed to both compartments of the reactor. The range of pressure is from about 7 torr to 70 torr, but preferably in the range from about 10 torr to about 40 torr.

Next valve 301 is closed, valve 302 is opened, and nitrogen dilutant is fed into both compartments of the treater reactor. The range of pressure is from about 100 torr to 700 torr, but preferably from about 400 torr to about 600 torr. Valve 302 is then closed. Using blower 170, the two compartments, vessels or chambers are cycled between two pressures, the expansion pressure being from about 75 torr to about 500 torr and the compression pressure being from 150 torr to about 1000 torr. Preferably the expansion pressure is from about 300 to about 400 torr and the compression pressure is from about 550 torr to about 750 torr. The cycle time is in a range from about 10 sec per cycle to about 600 sec per cycle, but preferably from about 30 sec to about 300 sec. Next valves 305 and 307 are opened, valves 306 and 308 are held closed. This causes expansion in compartment 150 and compression in compartment 160. Reverse the flow by opening valves 306 and 308 and closing valves 305 and 307 and this causes compression in compartment 150 and expansion in compartment 160. This cycling is continued until the treatment is complete. The number of cycles will vary from 1 to about 100, but preferably from 20 to about 60. The reaction time is from about 5 minutes to about 500 minutes, but preferably from about 10 minutes to about 100 minutes. Completeness of the treatment is determined by the fluorine consumption, and this is measured in an ultraviolet fluorine gas analyzer, such as a Dupont model 400 photometric analyzer. Then valves 304, 305 and 310 are opened to degas compartment 150 and fill compartment 160 with air.

Allow the pressure in compartment 150 to drop to about 350 torr. When the pressure reaches 350 torr, close valves 305 and 310. Open valves 306 and 309 to degassing compartment 160 and fill compartment 150 with air. Allow the pressure in compartment 160 to drop to 350 torr. Repeat the above, cycling 10 to 20 times in order to reduce the concentration of residual contaminant to less than 0.1 ppm. After the concentration is at the level indicated, open the doors and unload the treated containers. This process permits the use of a solid scrubber because the flow of gas to the scrubber is constant, also, the concentration of contaminant is in the range of low % to ppm. This is a great advantage because it introduces considerable safety into the process. In each batch, the reactant gas and the dilutant gas are fresh to prevent high concentrations of byproducts. In this case the byproducts are hydrogen fluoride, oxygen, water, carbon tetrafluoride, halocarbons, silicon tetrafluoride, sulfur tetrafluoride, etc. The increase in concentration of byproducts decreases the rate of .eaction and inhibits the completion of the surface treatment, so their removal is required. In the foregoing reaction, the hydrogen atoms of the polyethylene molecules on the surface of the containers is replaced by fluorine atoms.

What is claimed is:

1. The method of treating a surface comprising the steps of providing a gas in contact with the surface to be treated at a first pressure for a period of time, during which a chemical reaction takes place at the surface, reducing the pressure of the gas in contact with the surface to be treated for a second period of time, during which reaction byproduct are removed, re-establishing the first pressure of the gas in contact with the surface for a period of time during which the reaction takes place again, again reducing the pressure of the gas in contact with the surface for a period of time during which reaction byproduct are removed, and continuing the cycle of the first pressure and the reduced pressure until the surface has the desired characteristics.

2. The method of treating the surfaces of polyethylene containers comprising the steps of loading polyethylene containers into a closed vessel, heating said containers to an elevated treating temperature, providing fluorine gas in contact with the container surfaces to be treated at a first pressure for a period of time, during which a chemical reaction takes place at the surface, reducing the pressure of the gas in contact with the surface to be treated for a second period of time, during which reaction byproducts are removed, re-establishing the first pressure of the gas in contact with the surface for a period of time, during which the reaction takes place again, again reducing the pressure of the gas in contact with the surface for a period of time, during which reaction byproducts are removed, and continuing the cycle of the first pressure until the surface has the desired characteristics.

3. The method of treating the surface of polyethylene containers comprising the steps of loading polyethylene containers into first and second closed vessels, heating said containers in said vessels to an elevated treating temperature, providing fluorine gas in contact with the container surfaces to be treated at a first pressure in one vessel for a period of time, during which a chemical reaction takes place at the surface, and at a reduced pressure in the other vessel, reducing the pressure of the gas in contact with the surface to be treated in the one vessel for a second period of time, during which reaction byproducts are removed, and increasing the pressure of the gas in the other vessel for a period of time, during which the reaction takes place again, and continuing the cycle of alternating the first pressure and reduced pressure in the two vessels until the surfaces have the desired characteristics.

* * * * *

UNITED STATES PATENT AND TRADEMARK OFFICE
CERTIFICATE OF CORRECTION

PATENT NO. : 4,576,837

DATED : Mar. 18, 1986

INVENTOR(S) : Gregorio Tarancon, Efrain Acevedo, and Abel Saud

It is certified that error appears in the above-identified patent and that said Letters Patent is hereby corrected as shown below:

Column 1, line 28, change R/b2 to --R/2--

Signed and Sealed this

*Eighth* Day of *July 1986*

[SEAL]

*Attest:*

DONALD J. QUIGG

*Attesting Officer* *Commissioner of Patents and Trademarks*